US010304751B2

(12) United States Patent
Grassmann et al.

(10) Patent No.: US 10,304,751 B2
(45) Date of Patent: May 28, 2019

(54) ELECTRONIC SUB-MODULE INCLUDING A LEADFRAME AND A SEMICONDUCTOR CHIP DISPOSED ON THE LEADFRAME

(71) Applicant: Infineon Technologies AG, Neubiberg (DE)

(72) Inventors: Andreas Grassmann, Regensburg (DE); Juergen Hoegerl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/650,323

(22) Filed: Jul. 14, 2017

(65) Prior Publication Data

US 2017/0316999 A1    Nov. 2, 2017

Related U.S. Application Data

(62) Division of application No. 15/082,387, filed on Mar. 28, 2016, now Pat. No. 9,721,863.

(30) Foreign Application Priority Data

Mar. 31, 2015  (DE) .................. 10 2015 104 956

(51) Int. Cl.
*H01L 23/31* (2006.01)
*H01L 23/495* (2006.01)
*H01L 23/498* (2006.01)

(52) U.S. Cl.
CPC ...... *H01L 23/3114* (2013.01); *H01L 23/3121* (2013.01); *H01L 23/49517* (2013.01); *H01L 23/49562* (2013.01); *H01L 23/49844* (2013.01)

(58) Field of Classification Search
CPC ............. H01L 23/3121; H01L 23/3128; H01L 23/49844
See application file for complete search history.

(56) References Cited

U.S. PATENT DOCUMENTS

| 6,108,205 | A | 8/2000 | Bergstedt |
| 6,559,532 | B1 | 5/2003 | Schwarzbauer et al. |
| 2003/0015348 | A1 | 1/2003 | Lee et al. |
| 2004/0001661 | A1 | 1/2004 | Iwaki et al. |
| 2008/0029906 | A1* | 2/2008 | Otremba ............ H01L 23/3121 257/778 |
| 2016/0204057 | A1* | 7/2016 | Yato ................... H01L 24/743 257/684 |

FOREIGN PATENT DOCUMENTS

| CN | 101536181 A | 9/2009 |
| CN | 102456681 A | 5/2012 |
| CN | 103000618 A | 3/2013 |
| CN | 103531549 A | 1/2014 |
| CN | 104106319 A | 10/2014 |

* cited by examiner

*Primary Examiner* — Daniel P Shook
(74) *Attorney, Agent, or Firm* — Murphy, Bilak & Homiller, PLLC

(57) ABSTRACT

An electronic sub-module includes a leadframe, a semiconductor chip disposed on the leadframe and an encapsulation material disposed on the leadframe and on the semiconductor chip. The semiconductor chip has a first contact pad on a first main face of the semiconductor chip. The sub-module also includes a first contact element on a first main face of the electronic sub-module. The first contact element is electrically connected with the first contact pad. A surface area of the first contact element is greater than a surface area of the first contact pad.

18 Claims, 5 Drawing Sheets

ELECTRONIC SUB-MODULE INCLUDING A LEADFRAME AND A SEMICONDUCTOR CHIP DISPOSED ON THE LEADFRAME

PRIORITY CLAIM

This application is a Divisional of U.S. application Ser. No. 15/082,387 filed on 28 Mar. 2016, which in turn claims priority to German Patent Application No. 10 2015 104 956.2 filed on 31 Mar. 2015, the content of both of said applications incorporated herein by reference in their entirety.

TECHNICAL FIELD

The present application relates to an electronic module, in particular a circuit board including a leadframe, and to an electronic sub-module in the form of a packaged semiconductor chip.

BACKGROUND

A printed circuit board (PCB) multi-layer assembly generally comprises a layer stack of several electrically insulating or dielectric layers arranged one above the other with intermediate electrical conductor or wiring layers. Several embodiments and examples of PCB devices of this kind have become known up today. In particular, different approaches to embedding semiconductor chips within these PCB devices have been developed. These conventional approaches, however, suffer from different drawbacks which include sensitive and complex process steps and techniques which presently make these approaches cumbersome and sometimes impractical.

SUMMARY

An electronic module is disclosed. According to an embodiment, the electronic module includes a circuit board having a carrier layer, the carrier layer having a plurality of recess areas in a main surface thereof. The electronic module further includes a plurality of electronic sub-modules, each one of the sub-modules being disposed in one of the recess areas and each one of the sub-modules having a carrier, a semiconductor chip disposed on the carrier, and an encapsulation material disposed on the carrier and on the semiconductor chip.

According to another embodiment, the electronic module includes a printed circuit board having a leadframe, the leadframe having a plurality of recess areas in a main surface thereof. The electronic module further includes a plurality of electronic sub-modules each one of the sub-modules being disposed in one of the recess areas and each one of the sub-modules including a packaged semiconductor chip.

An electronic sub-module is disclosed. According to an embodiment, the electronic sub-module includes a leadframe, a semiconductor chip disposed on the leadframe, the semiconductor chip including at least one contact pad on a main face thereof, and an encapsulation material disposed on the leadframe and on the semiconductor chip. The sub-module includes at least one contact element on a main face thereof, wherein the contact element is electrically connected with the contact pad and the surface area of the contact element is greater than the surface area of the contact pad.

BRIEF DESCRIPTION OF THE DRAWINGS

FIG. 1 comprising

FIG. 2 comprising

FIG. 3 comprising

FIG. 4 comprising

DETAILED DESCRIPTION

Figure 1A:
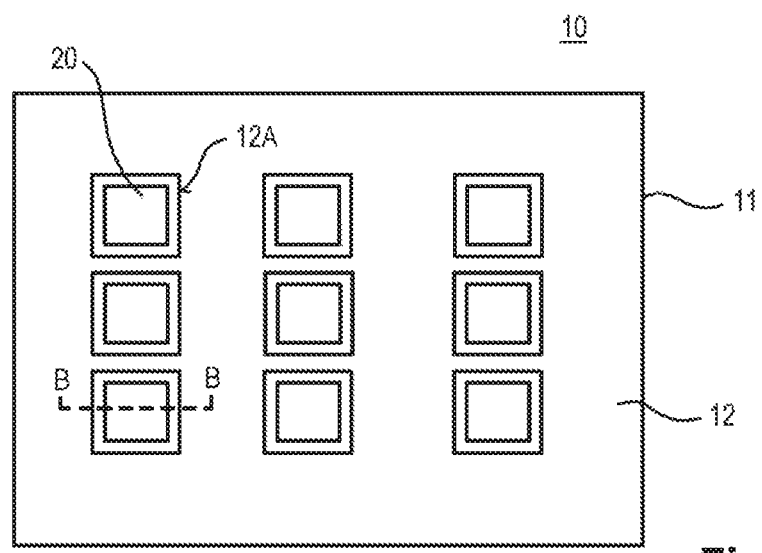
FIGS. 1A and 1B shows schematic top view (A) and cross-sectional side view (B) representations of an electronic module, according to an example.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is shown by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded," "attached," "connected," "coupled" and/or "electrically connected/electrically coupled" are not meant to mean that the elements or layers must directly be contacted together; intervening elements or layers may be provided between the "bonded," "attached," "connected," "coupled" and/or "electrically connected/electrically coupled" elements, respectively. However, in accordance with the disclosure, the above-mentioned terms may, optionally, also have the specific meaning that the elements or layers are directly contacted together, i.e., that no intervening elements or layers are provided between the "bonded," "attached," "connected," "coupled" and/or "electrically connected/electrically coupled" elements, respectively.

Further, the word "over" used with regard to a part, element or material layer formed or located "over" a surface may be used herein to mean that the part, element or material layer be located (e.g., placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g., placed, formed, deposited, etc.) "directly on", e.g., in direct contact with, the implied surface.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Electronic modules and electronic sub-modules containing semiconductor chips are described below. The semiconductor chips may be of different types, may be manufactured by different technologies and may include for example integrated electrical, electro-optical or electro-mechanical circuits and/or passives. The semiconductor chips may, for example, be designed as logic integrated circuits, analog integrated circuits, mixed signal integrated circuits, power integrated circuits, memory circuits or integrated passives. They may include control circuits, microprocessors or microelectromechanical components. Further, they may be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements in particular on its two main faces, that is to say on its top side and bottom side. In particular, power semiconductor chips may have a vertical structure. By way of example, the source electrode and gate electrode of a power MOSFET may be situated on one main face, while the drain electrode of the power MOSFET is arranged on the other main face. Furthermore, the electronic modules described below may include integrated circuits to control the integrated circuits of other semiconductor chips, for example the integrated circuits of power semiconductor chips. The semiconductor chips can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The examples of an electronic module and of an electronic sub-module may comprise an encapsulant or encapsulating material for embedding the semiconductor chip or other insulating or dielectric materials. These encapsulating, insulator or dielectric materials can be any electrically insulating material like, for example, any kind of molding material, any kind of resin material, or any kind of epoxy material. The mentioned materials can also comprise one or more of a polymer material, a polyimide material, a thermoplast material, a silicone material, a ceramic material, and a glass material. The mentioned materials may also comprise any of the above-mentioned materials and further include filler materials embedded therein like, for example, thermally conductive increments. These filler increments can be made of AlO or $Al_2O_3$, AlN, BN, or SiN, for example. Furthermore, the filler increments may have the shape of fibers and can be made of carbon fibers or nanotubes, for example. After its deposition the encapsulant, for example, may be only partially hardened and may be completely hardened after application of energy (e.g., heat, UV light, etc.) to form an encapsulant. Various techniques may be employed to cover the semiconductor chips with the encapsulant, for example one or more of compression molding, transfer molding, injection molding, power molding, liquid molding, dispensing or laminating.

Figure 1B:
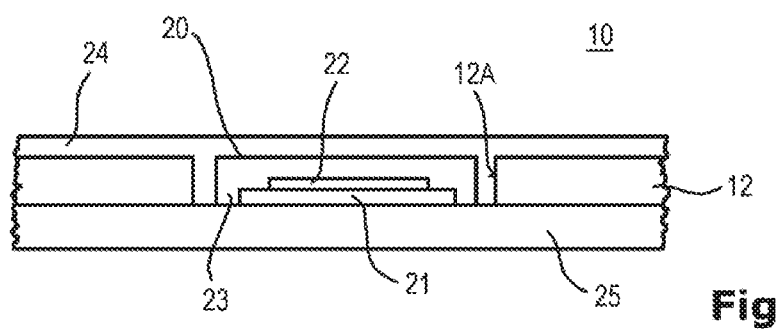

FIG. 1 comprises FIGS. 1A and 1B and depicts an example of an electronic module. The electronic module 10 is shown in its entirety in FIG. 1A wherein only a section thereof is shown in FIG. 1B in a cross-section along line B-B of FIG. 1A. The electronic module 10 comprises a circuit board 11, in particular a printed circuit board (PCB), comprising a carrier layer 12 comprising a plurality of recess areas 12A in a main surface thereof. The electronic module 10 further comprises a plurality of electronic sub-modules 20, each one of the sub-modules 20 being disposed in one of the recess areas 12A and each one of the sub-modules 20 comprising a carrier 21, a semiconductor chip 22 disposed on the carrier 21, and an encapsulation material 23 disposed on the carrier 21 and on the semiconductor chip 22.

In FIG. 1B, for reasons of simplicity, the electronic sub-module 20 is not shown in full detail, in particular technical details concerning the electrical contact pads of the semiconductor chip and the electrical contact elements of the sub-module and the respective spatial relationships between them are not depicted in FIG. 1B. Those details will be shown and explained along examples depicted in further figures below.

According to an example of the electronic module 10 of FIG. 1, the carrier layer 12 may comprise a metallic layer or a metallic sheet, in particular fabricated from copper or a copper alloy, wherein the carrier layer 12 more specifically comprises a leadframe.

According to another example of the electronic module 10 of FIG. 1, the carrier layer 12 comprises one or more of a dielectric material, an insulating material, a pre-impregnated ("prepreg") material, such as a fiber weave material impregnated with a resin bonding agent, or an FR4 material which comprises a woven glass and epoxy structure.

According to an example of the electronic module of FIG. 1, each one of the electronic sub-modules 20 is disposed in the respective recess area 12A in such a way that side edges of the electronic sub-module 20 are spaced apart from side walls of the recess area 12A. According to a further example thereof, the side edges of the electronic sub-module 20 are spaced in an equal distance from the side walls of the recess areas 12A along a circumference of the electronic sub-module 20 as is indicated in FIG. 1A. According to a further example thereof, spacers or spacer elements (not shown in FIG. 1) can be disposed between the side edges of the electronic sub-module 20 and the side walls of the recess area 12A, wherein those spacers or spacer elements can be formed contiguous or integral with either one of the electronic sub-module 20 or the carrier layer 12. A specific example thereof will be depicted and explained further below. A particular advantage of an equal distance between the side edges of the electronic sub-module 20 and the side walls of the recess area 12A is that the electronic sub-module 20 will be placed within the recess area 12A in a well-defined spatial position relative to the recess area 12A which facilitates the ease of further fabrication steps. One of these further fabrication steps can be the filling of the intermediate spaces between the side edges of the electronic sub-module 20 and the side walls of the recess area 12A with a dielectric material which is explained further below where it can be advantageous if the lateral width of the intermediate spaces is equal because otherwise improper filling may occur in such a way that unwanted voids are produced in intermediate spaces which are too narrow. Another one of these further fabrication steps can be the positioning and generating of vias in a layer disposed above the electronic sub-module, wherein the vias are to be positioned above an electrical contact area on an upper surface of the electronic sub-module, for example.

According to an example of the electronic module 10 of FIG. 1, the electronic module 10 further comprises a dielectric layer 24 disposed above the main surface of the carrier layer 12 and the electronic sub-modules 20. According to an example thereof, the dielectric layer 24 may comprise a prepreg material, in particular an example of a prepreg material which comprises specific properties. Those specific properties should allow to apply a layer of the prepreg material onto the carrier layer 12 and the inserted electronic sub-modules 20 and afterwards to press and heat-treat the prepreg layer so that the resin contained in the prepreg layer liquefies and flows into the intermediate spaces between the side edges of the electronic sub-modules 20 and the side walls of the recess areas 12A so that these intermediate spaces are filled up with resin material of the prepreg material before hardening. According to a further example thereof, as a result of such a process, the hardened dielectric or prepreg layer 24 extends into the intermediate spaces between the side edges of the electronic sub-modules 20 and the side walls of the recess areas 12A.

According to an example of the electronic module 10 of FIG. 1, the recess areas 12A can be configured as shown in FIG. 1A, i.e., as void areas in which the material of the carrier layer 12 is completely removed. However, it can also be the case that the material of the carrier layer 12 is not completely removed in the recess areas 12 but only down to a certain plane within the carrier layer 12 wherein the height of the removed material corresponds to the height of the electronic sub-module to be placed in the recess areas 12A. In any event, as a result an upper surface of the carrier layer 12 and an upper surface of the inserted electronic sub-modules 20 should be coplanar as is shown in FIG. 1B. Removing the material of the carrier layer 12 for producing the recess areas 12A can be done by cutting, milling, punching or stamping out of the upper main surface of the carrier layer 12.

According to an example of the electronic module 10 of FIG. 1, the semiconductor chips 22 of the electronic sub-modules 20 are electrically interconnected so as to form an electrical circuit. According to an example thereof, the electrical circuit comprises one or more of a motor drive circuit, a half-bridge circuit, an AC/AC converter circuit, an AC/DC converter circuit, a DC/AC converter circuit, a DC/DC converter circuit, a buck converter circuit, and a frequency converter circuit.

According to an example of the electronic module 10 of FIG. 1, each one of the semiconductor chips 22 comprises at least one contact pad on a main face of the semiconductor chip 22, and each one of the electronic sub-modules 20 comprises at least one contact element on a main face of the electronic sub-module 20, wherein the contact element is electrically connected with the contact pad of the semiconductor chip 22 and the surface area of the contact element is greater than the surface area of the contact pad. In particular, the contact pad can be the gate pad of a semiconductor transistor chip. According to a further example thereof, the surface area of the contact element is disposed or at least extends laterally beyond the outer contour of the semiconductor chip 22. A specific example of such an electronic sub-module will be depicted and explained later.

According to an example of the electronic module 10 of FIG. 1, one or more of the electronic sub-module 20 and the recess area 12A comprises a lateral square-shaped cross-section. According to a further example thereof, the electronic sub-module 20 comprises either sharp or rounded or radiused corners.

According to an example of the electronic module 10 of FIG. 1, an upper surface of the carrier layer 12 is coplanar with an upper surface of the electronic sub-modules 20.

According to an example of the electronic module 10 of FIG. 1, the electronic module 10 further comprises a first dielectric layer 24 disposed above the main surface of the carrier layer 12 and the electronic sub-modules 20, the first dielectric layer 24 comprising electrical via connections connected with the semiconductor chips 22 of the electronic sub-modules 20. According to a further example thereof, the electronic module 10 further comprises a second dielectric layer 25 disposed above a lower main surface of the carrier layer 12. According to a further example thereof, one or more of the first and second dielectric layers 24 and 25 comprise one or more of a resin material, a prepreg material, and an FR4 material. The electronic module 10 may also comprise further dielectric or metallic wiring layers.

Figure 2A:
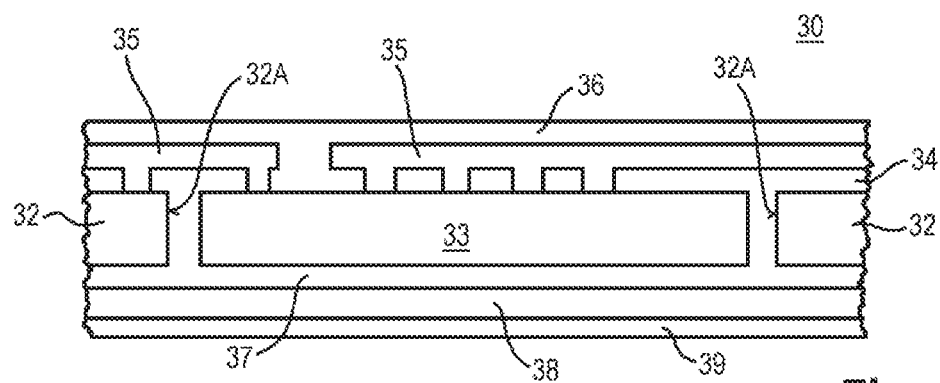
FIGS. 2A and 2B shows schematic cross-sectional side view (A, B) representations of a first example of an electronic module comprising a vertically structured semiconductor transistor chip, wherein all electrical contacts are laid to the front side of the module (A) and a second example of an electronic module comprising a vertically structured semiconductor transistor chip, wherein a first one of the electrical contacts is laid to the backside of the module and the other electrical contacts are laid to the front side of the module (B).
Figure 2B:
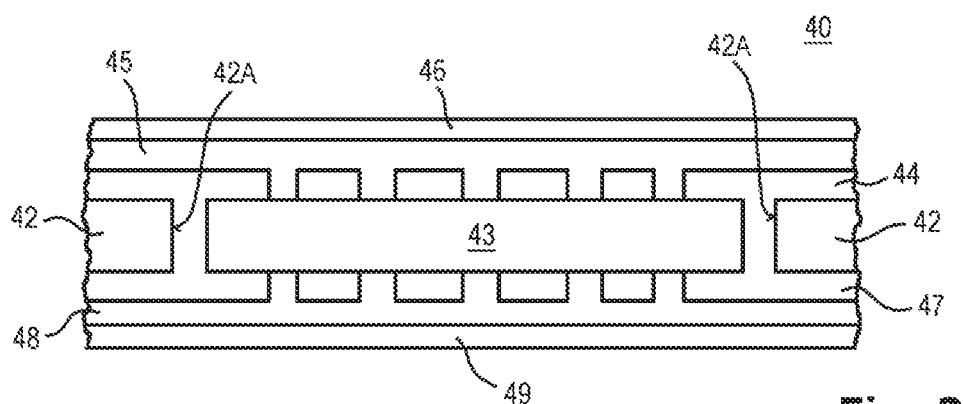

FIG. 2 comprising FIGS. 2A and 2B shows schematic cross-sectional side view representations of two examples of electronic modules.

FIG. 2A shows a section of an electronic module 30 in a way as FIG. 1B. The electronic module 30 of FIG. 2A comprises a carrier 32 having a recess area 32A formed therein by, for example, cutting, milling, punching or stamping as was explained above. The carrier 32 can, for example, be a leadframe or a printed circuit board (PCB). The electronic module 30 further comprises an electronic sub-module 33 inserted into the recess area 32A with the side edges of the electronic sub-module 33 being spaced apart from the side walls of the recess area 32A. The electronic module 30 further comprises a first (inner) dielectric layer 34 disposed onto the carrier 32 and the electronic sub-module 33 and extending into the intermediate spaces between the side edges of the electronic sub-module 33 and the side walls of the recess area 32A. The electronic module 30 further comprises a first (upper) metal layer 35 disposed onto the first dielectric layer 34. The first metal layer 35 is connected with an electrical contact area of the electronic sub-module 33 through via connections formed in the first dielectric layer 34. More specifically, a first portion of the first metal layer 35 on the right side can be connected with an emitter or source contact element of the electronic sub-module 33 and a second portion of the first metal layer 35 on the left side can be electrically connected with a collector or drain electrical contact of the electronic sub-module 33. A further portion (not shown) of the first metal layer 35 can be electrically connected with a gain electrical contact of the electronic sub-module 33. The electronic module 30 further comprises a second (outer) dielectric layer 36 formed onto the first metal layer 35. The electronic module 30 further comprises a third (inner) dielectric layer 37 formed onto a lower main face of the carrier 32 and a lower main face of the electronic sub-module 33. A second metal layer 38 is formed onto a lower face of the third dielectric layer 37. A fourth dielectric layer 39 is formed onto a lower face of the second metal layer 38. The electronic sub-module 33 is configured in such a way that its outer electrical contact elements are formed on the upper main face thereof.

FIG. 2B shows an electronic module 40 comprising a carrier 42 having a recess area 42A formed therein by, for example, cutting, milling, punching or stamping as was explained above. The carrier 42 can, for example, be a leadframe or a printed circuit board (PCB). The electronic module 40 further comprises an electronic sub-module 43 inserted into the recess area 42A. A first (inner) dielectric layer 44 is formed onto an upper main face of the carrier 42 and an upper main face of the electronic sub-module 43. A first (upper) metal layer 45 is formed onto the first dielectric layer 44. The first metal layer 45 is electrically connected with one or more electrical contact elements of the electronic sub-module 43 by via connections formed in the first dielectric layer 44. More specifically, a first portion of the first metal layer 45 can be connected with an emitter or source contact element of the electronic sub-module 43. Another portion (not shown) of the first metal layer 45 can be connected with a gate contact element of the electronic sub-module 43. The first dielectric layer 44 extends into intermediate spaces formed between side edges of the electronic sub-module 43 and side walls of the recess area 42A. A second (outer) dielectric layer 46 is formed onto an upper face of the first metal layer 45. A third (inner) dielectric layer 47 is formed on a lower main face of the leadframe 42 and on a lower main face of the electronic sub-module 43. A second metal layer 48 is formed on a lower main face of the third dielectric layer 47. The second metal layer 48 is connected to one or more contact elements of the electronic sub-module 43 by via connections formed in the third dielectric layer 47. More specifically, the second metal layer 48 can be connected to the drain or collector contact of the electronic sub-module 43. A fourth dielectric layer 49 is formed onto a lower main face of the second metal layer 48. The electronic sub-module 43 is configured in such a way that it comprises one or more electrical contact elements on an upper main face and one or more contact elements on a lower main face.

Figure 3A:
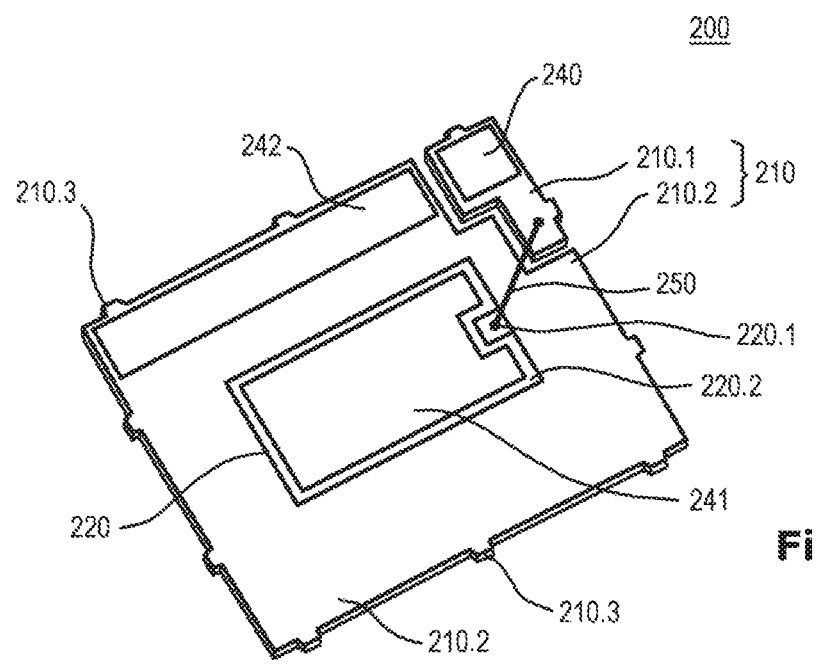
FIGS. 3A and 3B shows schematic perspective top view representations of an electronic sub-module of the type of FIG. 2A in an intermediate state of its fabrication yet without an encapsulation material (A) and in a final state of its fabrication being provided with an encapsulation material (B).
Figure 3B:
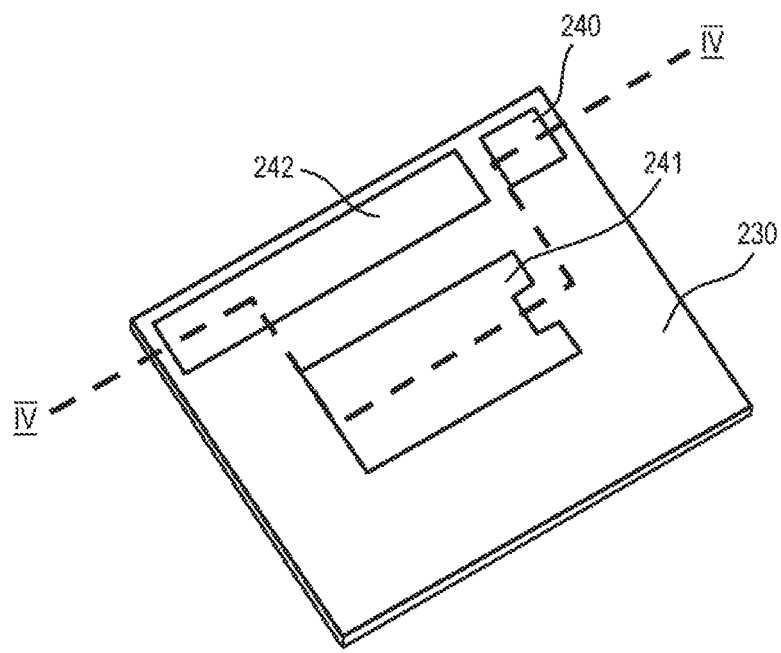

FIG. 3 comprising FIGS. 3A and 3B shows schematic perspective top view representations of an electronic sub-module according to an example.

FIGS. 3A and 3B show an electronic sub-module 200 comprising a carrier, in particular a leadframe 210, a semiconductor chip 220 disposed on the leadframe 210, the semiconductor chip 220 comprising a first contact pad (gate pad) 220.1 on an upper main face of the semiconductor chip 220. The electronic sub-module 200 further comprises an encapsulation material 230 disposed on the leadframe 210 and on the semiconductor chip 220, wherein the electronic sub-module 200 further comprises a first contact element 240 which is electrically connected with the first contact pad 220.1 and the surface area of the first contact element 240 is greater than the surface area of the first contact pad 220.1.

According to an example of the electronic sub-module 200 of FIG. 3, the leadframe 210 comprises a first portion 210.1, whereupon the first contact element 240 is mounted 210.1 and a second portion 210.2, whereupon the semiconductor chip 220 is mounted. The first and second portions 210.1 and 210.2 are electrically separated from each other. According to a further example thereof, the first contact pad 220.1 is electrically connected with the first portion 210.1 of the leadframe 210 by a wire bond or clip 250.

According to an example of the electronic sub-module 200, the first contact element 240 comprises a metal plate or metal post, in particular a copper plate. The metallic plate 240 can be attached to the first portion 210.1 of the leadframe 210 by soldering using a Zn or Pb based solder paste, or by welding or sintering.

According to an example of the electronic sub-module 200, the first contact element 240 can be an integral, contiguous or continuous part of the first portion 210.1 of the leadframe 210 wherein the first contact element 240 can be an elevation generated by, for example, etching away an upper layer of the first portion 210.1 besides the area of the first contact element 240. The elevation can also be generated by bending an area of the first portion 210.1 upwards from below the first portion 210.1.

Regardless of the way of producing it, the first contact element 240 may comprise a thickness in a range from 50 µm to 500 µm, more specifically from 100 µm to 400 µm, more specifically from 200 to 300 µm.

According to an example of the electronic sub-module 200, the semiconductor chip 220 comprises a second contact pad 220.2 on the upper main face. In particular, the semiconductor chip 220 comprises a vertical transistor structure like, for example, an insulated gate bipolar (IGB) transistor, wherein the first contact pad 220.1 corresponds to the gate pad and the second contact pad 220.2 corresponds to the source or emitter pad and the drain or collector pad (not to be seen in FIG. 3) is disposed on a back main face of the semiconductor chip 220. The electronic sub-module 200 may further comprise a second contact element 241 attached onto the second contact pad 220.2 by soldering using a Zn or Pb based solder paste, or by welding or sintering. The second contact element 241 may be produced by attaching a metal plate or metal post to the second contact pad 220.2. It may comprise a thickness in a range from 100 µm to 300 µm, more specifically from 120 µm to 200 µm.

The electronic sub-module 200 may further comprise a third contact element 242 which may be directly attached onto the second portion 210.2 of the leadframe 210 so that it is electrically connected with the drain or collector pad of the semiconductor chip 220. The third contact element 242 may be produced in a similar way like the first and second contact elements 240 and 241. It may comprise a thickness in a range from 50 µm to 500 µm, more specifically from 100 µm to 400 µm, more specifically from 200 to 300 µm.

In any case, the thickness of the first, second and third contact elements 240, 241 and 242 may be chosen such that their upper surfaces are coplanar with each other and coplanar with an upper surface of the encapsulation material 230 as can be seen in FIG. 4, for example.

According to an example of the electronic sub-module 200 of FIG. 3, the semiconductor chip comprises a thickness in a range from 50 mm to 250 µm.

According to an example of the electronic sub-module 200 of FIG. 3, the leadframe 210 may comprise protrusions 210.3 at the side edges thereof, the protrusions 210.3 resulting e.g. from the fabrication process of the leadframe 210. The protrusions 210.3 may be equally spaced along the outer circumference of the leadframe 210 and, in case that they are not completely embedded by the encapsulation material 230 as shown in FIG. 3B, they may serve as spacers or spacer elements when inserting the electronic sub-module 200 into a recess area 12A of the carrier layer 12 as shown in FIG. 1. They may also serve for thermal and/or electrical functions as will be explained later.

Figure 4A:
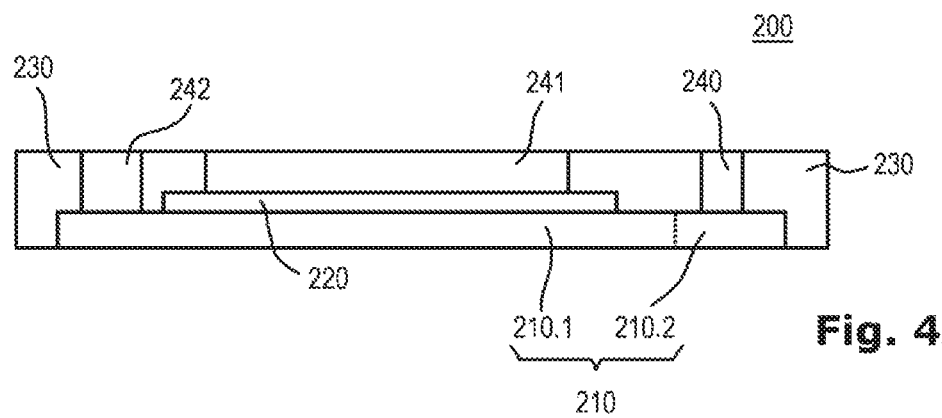
FIGS. 4A and 4B shows schematic cross-sectional side view representations of a first example of an electronic sub-module comprising a vertically structured semiconductor transistor chip, wherein all electrical contacts are laid to the front side of the sub-module (A) and a second example of an electronic sub-module comprising a vertically structured semiconductor transistor chip, wherein a first one of the electrical contacts is laid to the backside of the sub-module and the other electrical contacts are laid to the front side of the sub-module (B).
Figure 4B:
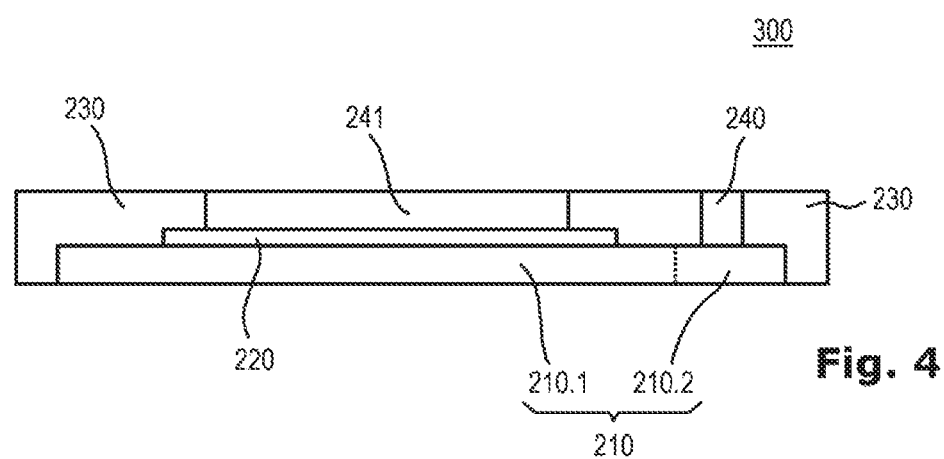

FIG. 4 comprising FIGS. 4A and 4B shows two examples of an electronic sub-module, wherein FIG. 4A depicts a schematic cross-sectional side view representation of the electronic sub-module 200 of FIG. 3 along a line IV-IV of FIG. 3B.

As can be seen in FIG. 4A, the leadframe 210 comprises a first (lower) main face and a second (upper) main face opposite to the first main face and side faces connecting the first and second main faces, wherein the first main face of the leadframe 210 extends along a lower surface of the sub-module 200 and the second main face is partly covered by the semiconductor chip 220 and partly covered by the encapsulation material 230 and the side faces of the leadframe are completely covered by the encapsulation material 230 with the exception of perhaps the protrusions 210.3 which may extend laterally beyond the encapsulation material 230 or at least until the surface of the encapsulation material 230.

As already mentioned above, the first, second and third contact elements 240, 241 and 242 comprise upper surfaces which are coplanar with each other and coplanar with an upper surface of the encapsulation material 230. The fabrication of the electronic sub-modules can be performed in such a way that the semiconductor chip 220 is attached to the leadframe 210, the contact elements 240, 241 and 242 are attached to the semiconductor chip 220 or the leadframe 210, in particular one of the leadframe portions 210.1 or 210.2, respectively, and finally the encapsulation material 230 is applied in such a way that it embeds the leadframe 210 and the semiconductor chip 220 and forms an upper surface which is coplanar with the upper surfaces of the contact elements 240, 241 and 242. The applying of the encapsulation material 230 can be performed e.g., by compression molding or transfer molding. In the case of compression molding the immediate result will be that the contact elements 240, 241 and 242 are covered by excessive encapsulation material. After hardening of the encapsulation material, the encapsulation material will be grinded from above by, for example, mechanical grinding or polishing until the upper surfaces of the contact elements 240, 241 and 242 are reached. The grinding will be stopped only until a planar surface is obtained where the upper surfaces of the contact elements 240, 241, 242 and the encapsulation material 230 are coplanar. Therefore, in any case, even if one or more of the contact elements 240, 241 and 242 was attached to the leadframe 210 or the semiconductor chip 220 in such a way that its upper surface is inclined or not coplanar with the upper surfaces of the other contact elements, the final result after grinding will be upper surfaces completely coplanar with each other.

FIG. 4B depicts another example of an electronic sub-module. In this example the contact element 242 of the electronic sub-module of FIG. 3 and FIG. 4A is omitted so that there is no electrical connection from the drain or collector contact to the upper surface of the module. The electronic sub-module 300 of FIG. 4B will thus have electrical contacts at the upper surface as well as the lower surface.

According to a further example of an electronic sub-module, the gate contact element 240 can also be formed directly above the gate pad of the semiconductor chip and can have the form of a trapezoid wherein the smaller one of its surfaces is attached to the gate pad and the greater one of its surfaces is coplanar with the upper surface of the sub-module so that the surface area of the contact element is greater than the surface area of the contact pad.

Figure 5:
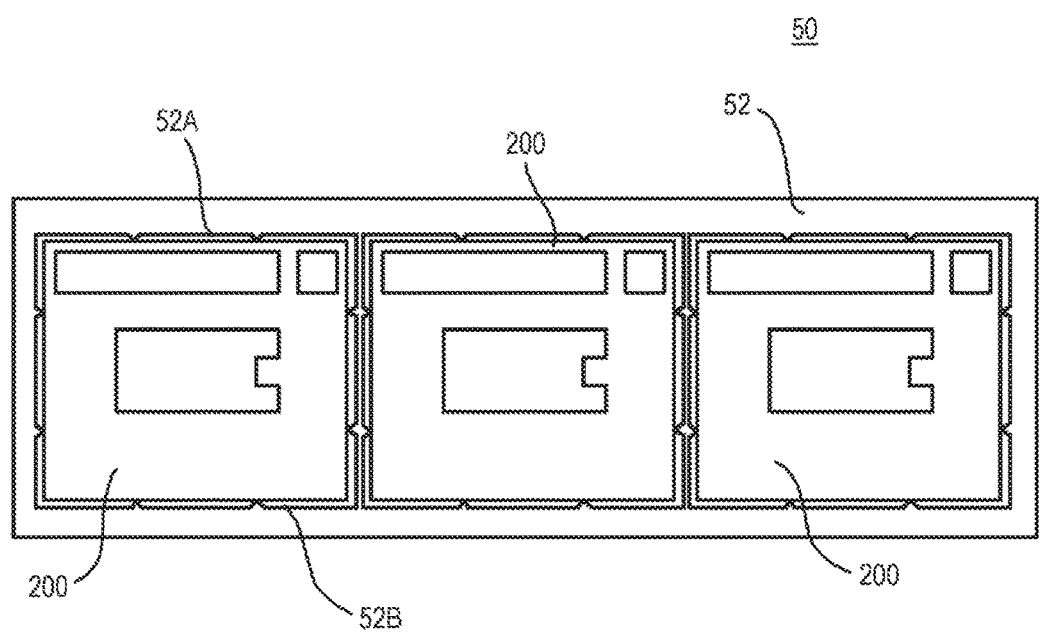
FIG. 5 shows a schematic top view representation of an example of an electronic module of the type of FIG. 2A or FIG. 4A comprising electronic sub-modules disposed in respective recess areas of the electronic module, wherein side walls of the recess area comprise spacer elements.

FIG. 5 shows a top view of an electronic module 50 comprising three recess areas 52A each of which having one electronic sub-module 200 inserted therein. The electronic sub-modules are of the type as shown in FIG. 2A, FIG. 3, and FIG. 4A. The recess areas 52A may be formed by cutting, milling, punching or stamping into a carrier layer 52 as previously described. The side walls of the recess areas 52A comprise protrusions 52B extending in an inward direction so that the electronic sub-modules 200 are held in spatially defined positions within the recess areas 52A. The protrusions 52B can be formed contiguous, continuous or integral with the carrier layer 52. In addition thereto, the protrusions 52B may fulfill one or more of an electrical or thermal function as, for example, electrically connecting the leadframes of the electronic sub-modules 200 or dissipating excessive heat generated by the semiconductor chips of the electronic sub-modules 200. The protrusions 52B may be utilized either instead of or in addition to the protrusions 210.3 which were shown in connection with FIG. 3A. If both of them are employed, they can be located in such a way that they form pairs in which a protrusions 210.3 of the carrier 210 and a protrusion 52B of the carrier layer 52 face each other and are electrically and mechanically connected with each other to fulfill the above-mentioned electrical and/or thermal functions.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic sub-module, comprising:
a leadframe;
a semiconductor chip disposed on the leadframe, the semiconductor chip comprising a first contact pad on a first main face of the semiconductor chip; and
an encapsulation material disposed on the leadframe and on the semiconductor chip,
wherein the sub-module comprises a first contact element on a first main face of the electronic sub-module,
wherein the first contact element is electrically connected with the first contact pad,
wherein a surface area of the first contact element is greater than a surface area of the first contact pad,
wherein the leadframe comprises first and second main faces that are opposite one another and side faces extending between the first and second main faces of the lead frame,
wherein the side faces of the leadframe are completely covered by the encapsulation material,
wherein the semiconductor chip is mounted on the second main face of the lead frame,
wherein the first main face of the lead frame faces the second main face of the electronic sub-module,
wherein the second main face of the lead frame faces the first main face of the electronic sub-module.

2. The electronic sub-module of claim 1, wherein the surface area of the first contact element extends laterally beyond an outer contour of the semiconductor chip.

3. The electronic sub-module of claim 1,
wherein the leadframe comprises a first portion and a second portion,
wherein the first contact element is mounted to the first portion,
wherein the semiconductor chip is mounted to the second portion,
wherein the first and the second portions are electrically separated from each other.

4. The electronic sub-module of claim 3, wherein the first contact pad is electrically connected with the first portion of the leadframe by a wire bond or clip.

5. The electronic sub-module of claim 3, wherein the first contact element is an elevated part of the first portion of the leadframe.

6. The electronic sub-module of claim 3,
wherein the semiconductor chip comprises a vertical transistor structure,
wherein the semiconductor chip comprises a second contact pad on the first main face of the semiconductor chip,
wherein the first contact pad corresponds to a gate pad and the second contact pad corresponds to a source or emitter pad
wherein the electronic sub-module further comprises a second contact element attached to the second contact pad.

7. The electronic sub-module of claim 6, wherein the second contact element comprises a metal plate or metal post attached to the second contact pad.

8. The electronic sub-module of claim 6, wherein a drain or collector pad is disposed on a second main face of the semiconductor chip opposite the first main surface.

9. The electronic sub-module of claim 8, further comprising a third contact element directly attached to the second portion of the leadframe and electrically connected with the drain or collector pad of the semiconductor chip.

10. The electronic sub-module of claim 9, wherein upper surfaces of the first, the second and the third contact elements are coplanar with each other and coplanar with an upper surface of the encapsulation material.

11. The electronic sub-module of claim 1, further comprising protrusions at side edges of the leadframe, wherein the protrusions are not completely embedded by the encapsulation material.

12. The electronic sub-module of claim 1, wherein the first contact element comprises a metal plate or metal post.

13. The electronic sub-module of claim 1,
wherein the semiconductor chip comprises a second main face opposite the first main face of the semiconductor chip,
wherein the semiconductor chip comprises a third contact pad on the second main face of the semiconductor chip, and
wherein the third contact pad is electrically connected to the lead frame.

14. The electronic sub-module of claim 13,
wherein the sub-module further comprises a second contact element,
wherein the semiconductor chip further comprises a second contact pad on the first main face of the semiconductor chip,
wherein the first contact element extends from the second main face of the lead frame to the first main face of the sub-module, and
wherein the second contact element extends from the second contact pad to the first main face of the sub-module.

15. The electronic sub-module of claim 14,
wherein the sub-module further comprises a third contact element that is electrically connected with the third contact pad, and
wherein the third contact element extends from the second main face of the lead frame to the first main face of the sub-module.

16. The electronic sub-module of claim 15,
wherein upper surfaces of the first, second and third contact elements are coplanar with each other and with the first main face of the sub-module.

17. The electronic sub-module of claim 16,
wherein a thickness of the second contact element is greater than both thicknesses of the first and third contact element, the thicknesses of the first, second and third contact elements being measured in a vertical direction that is perpendicular to the first and second main faces of the sub-module.

18. The electronic sub-module of claim 1, wherein the second main face of the lead frame is coplanar with the second main face of the electronic sub-module.

* * * * *